United States Patent
Maleki et al.

(10) Patent No.: US 7,173,749 B2
(45) Date of Patent: Feb. 6, 2007

(54) OPTO-ELECTRONIC FEEDBACK FOR STABILIZING OSCILLATORS

(75) Inventors: Lutfollah Maleki, Pasadena, CA (US);
Vladimir Ilchenko, Arcadia, CA (US)

(73) Assignee: California Institute of Technology, Pasadena, CA (US)

( * ) Notice: Subject to any disclaimer, the term of this patent is extended or adjusted under 35 U.S.C. 154(b) by 341 days.

(21) Appl. No.: 10/911,401

(22) Filed: Aug. 4, 2004

(65) Prior Publication Data

US 2005/0063034 A1    Mar. 24, 2005

Related U.S. Application Data

(60) Provisional application No. 60/492,572, filed on Aug. 4, 2003.

(51) Int. Cl.
| | |
|---|---|
| G02F 1/01 | (2006.01) |
| G02F 1/00 | (2006.01) |
| G02F 1/03 | (2006.01) |
| H01S 3/10 | (2006.01) |
| G01N 27/00 | (2006.01) |

(52) U.S. Cl. ............ 359/239; 359/237; 359/245; 359/279; 359/334; 372/20; 372/29.011; 372/94; 372/108; 331/1 R; 331/16; 331/66; 250/205; 250/227.11; 385/39; 385/50; 398/39

(58) Field of Classification Search ............ 359/237, 359/239, 245, 279, 334; 372/9, 20, 29.011, 372/32, 50.1, 50.21, 94, 98, 104, 108; 331/1 R, 331/16, 25, 66, 172; 250/205, 227.11; 385/37, 385/39, 50; 398/39, 161
See application file for complete search history.

(56) References Cited

U.S. PATENT DOCUMENTS

| 5,204,640 A | 4/1993 | Logan, Jr. .................. 331/9 |
| 5,220,292 A | 6/1993 | Bianchini et al. ........... 331/1 R |

(Continued)

FOREIGN PATENT DOCUMENTS

WO    WO0196936    12/2001

OTHER PUBLICATIONS

Logan et al.; Stabilization of Oscillator Phase Using a Fiber-Optic Delay-Line; 1991; 45th Annual Symposium on Frequency Control; pp. 508-512.

(Continued)

Primary Examiner—Loha Ben
(74) Attorney, Agent, or Firm—Fish & Richardson P.C.

(57) ABSTRACT

This application describes use of an opto-electronic feedback in oscillators to suppress phase noise based on the high Q factor of the opto-electronic feedback.

27 Claims, 4 Drawing Sheets

U.S. PATENT DOCUMENTS

| | | | |
|---|---|---|---|
| 5,723,856 A | 3/1998 | Yao et al. | 250/227.11 |
| 5,777,778 A | 7/1998 | Yao | 359/245 |
| 5,917,179 A | 6/1999 | Yao | 250/227.11 |
| 5,929,430 A | 7/1999 | Yao et al. | 250/205 |
| 6,138,076 A | 10/2000 | Graf et al. | 702/14 |
| 6,389,197 B1 | 5/2002 | Iltchenko et al. | 385/28 |
| 6,417,957 B1 | 7/2002 | Yao | 359/334 |
| 6,473,218 B1 | 10/2002 | Maleki et al. | 359/245 |
| 6,476,959 B2 | 11/2002 | Yao | 359/334 |
| 6,487,233 B2 | 11/2002 | Maleki et al. | 372/108 |
| 6,488,861 B2 | 12/2002 | Iltchenko et al. | 216/24 |
| 6,490,039 B2 | 12/2002 | Maleki et al. | 356/436 |
| 6,535,328 B2 | 3/2003 | Yao | 359/334 |
| 6,567,436 B1 | 5/2003 | Yao et al. | 372/32 |
| 6,580,532 B1 | 6/2003 | Yao et al. | 398/39 |
| 6,594,061 B2 | 7/2003 | Huang et al. | 359/239 |
| 6,762,869 B2 | 7/2004 | Maleki et al. | 359/239 |
| 6,928,091 B1 * | 8/2005 | Maleki et al. | 372/20 |
| 2002/0018611 A1 | 2/2002 | Maleki et al. | 385/15 |
| 2003/0012504 A1 | 1/2003 | Itchenko | 385/39 |

OTHER PUBLICATIONS

L.E. Myers, et al.; Quasi-phase-matched optical parametric oscillators in bulk periodically poled $LiNbO_3$; Nov. 1995; J.Opt. Soc. Am. B/vol. 12, No. 11; pp. 2102-2116.

X. Steve Yao, et al.; Converting Light into Spectrally Pure Microwave Oscillation; Apr. 1996; Optics Letters, vol. 21, No. 7; pp. 483-485.

H. Ito, et al.; InP/InGaAs uni-travelling-carrier photodiode with 310 GHz receiver; Oct. 12, 2000; Electronics Letters, vol. 36, No. 21; pp. 1809-1810.

V. Ilchenko, et al.; Sub-Micro Watt Photonic Microwave Receiver; Nov. 2002; IEEE Photonics Technology Letters, vol. 14, No. 11; pp. 1602-1604.

* cited by examiner

OPTO-ELECTRONIC FEEDBACK FOR STABILIZING OSCILLATORS

This application claims the benefit of U.S. Provisional Patent Application No. 60/492,572 entitled "Simple opto-electric feedback in microwave and millimeter-wave oscillators" and filed Aug. 4, 2003, the entire disclosure of which is incorporated herein by reference as part of the specification of this application.

The research and development for inventions described in this application received funding under Grant No. NAS7-1407 from NASA. The U.S. Government may have rights to various technical features described in this application.

BACKGROUND

This application relates to RF, microwave, and millimeter-wave oscillators.

Signal oscillators operating oscillating frequencies in the RF, microwave, and millimeter frequencies are widely used for in various applications. As an example, such oscillation signals at these frequencies may be used for generating, tracking, cleaning, amplifying, and distributing RF carriers. Such an oscillator may exhibit phase noise and cause the oscillating frequency to draft or fluctuate. This phase noise is undesirable and may adversely affect device performance in devices using such an oscillator.

One way to mitigate this phase noise in signal oscillators is to provide a negative feedback control loop where the feedback signal is out of phase with the oscillator signal in order to stabilize the oscillator. For example, a voltage-controlled oscillator (VCO) may be designed to use voltage controlled phase-locked loop to control the oscillator frequency by minimizing the difference between the current phase values of the oscillator signal and of another relatively delayed oscillation signal. A typical VCO is a two-port device and the phase-locked loop is connected between the two ports. VCOs may be used for, among others, clock recovery, carrier recovery, signal modulation and demodulation, and frequency synthesizing.

A negative opto-electronic feedback loop may be used as the phase-locked loop in a VCO. U.S. Pat. No. 5,204,640 to Logan describes tunable voltage controlled two-port oscillators that use feedback loops with a fiber optic delay line to provide a long delay of, e.g., one millisecond or more, in stabilizing the oscillators. Such a feedback loop is an opto-electronic loop because part of the loop is the fiber optic delay line and part of the loop is electronic circuitry. A photodetector is used to convert the optical signal in the fiber optic delay line into an electronic signal in the electronic circuitry. Also, see Logan et al. in "Stabilization of Oscillator Phase Using a Fiber-Optic Delay-Line" on pages 508–512 in 45$^{th}$ Annual Symposium On Frequency Control (1991).

SUMMARY

This application describes oscillators with a feedback control that is derived from a positive, oscillating opto-electronic closed loop of a separate opto-electronic oscillator. In one implementation, for example, a device described in this application includes an oscillator producing an electrical oscillation signal, and an opto-electronic oscillator coupled to the oscillator. The opto-electronic oscillator includes a positive feedback loop which comprises an optical section, an electrical section, and an optical detector to connect the optical section and the electrical section. The optical section comprises an optical modulator modulating light under control of an electrical output signal from the electrical section and an optical delay line to receive an optical output of the optical modulator. The electrical section of the positive feedback loop is coupled to receive the electrical oscillation signal from the oscillator and to send an electrical signal in the electrical section into the oscillator to suppress phase noise in the oscillator.

In the above implementation, a phase shifter may be coupled between the electrical section of the opto-electronic oscillator and the oscillator. An electrical signal circulator may be coupled to the electrical section to direct the electrical oscillation signal from the oscillator into the electrical section and to direct the electrical signal in the electrical section into the oscillator. The optical delay line may be a fiber line or an optical resonator.

Hence, one signal port of an oscillator may be used to both receive an oscillation signal from the oscillator for coupling the oscillation signal into the positive feedback loop of the opto-electronic oscillator, and feedback a feedback oscillation signal from the opto-electronic oscillator into the oscillator to stabilize the oscillator. Various one-port oscillator devices may be stabilized using an opto-electronic oscillator, such as Gunn diode oscillators and impact ionization avalanche transit-time (IMPATT) diode oscillators, Klystron or Clystron electron oscillators, backward-wave oscillators, YIG oscillators and others. In combination with recent development of ultra-high-speed photodetectors and optical modulators, opto-electronic oscillators may be used to stabilize oscillators at high frequencies in the range of tens of gigahertz and beyond 100 GHz.

A method for stabilizing an oscillator is also described as an example. In this method, an output oscillation signal from a signal port of an oscillator is directed into an electrical section of an opto-electronic oscillator having an optical section and the electrical section which form a closed loop with a positive feedback. An oscillation signal that is produced in the electrical section from an optical signal in the optical section is then injected into the signal port of the oscillator to stabilize the oscillator. If the oscillator is tunable, the oscillator can tuned to switch between different modes of the closed loop in the opto-electronic oscillator.

These and other implementations, features, and associated advantages are described in greater detail in the drawings, the detailed description, and the claims.

DETAILED DESCRIPTION

Figure 1:
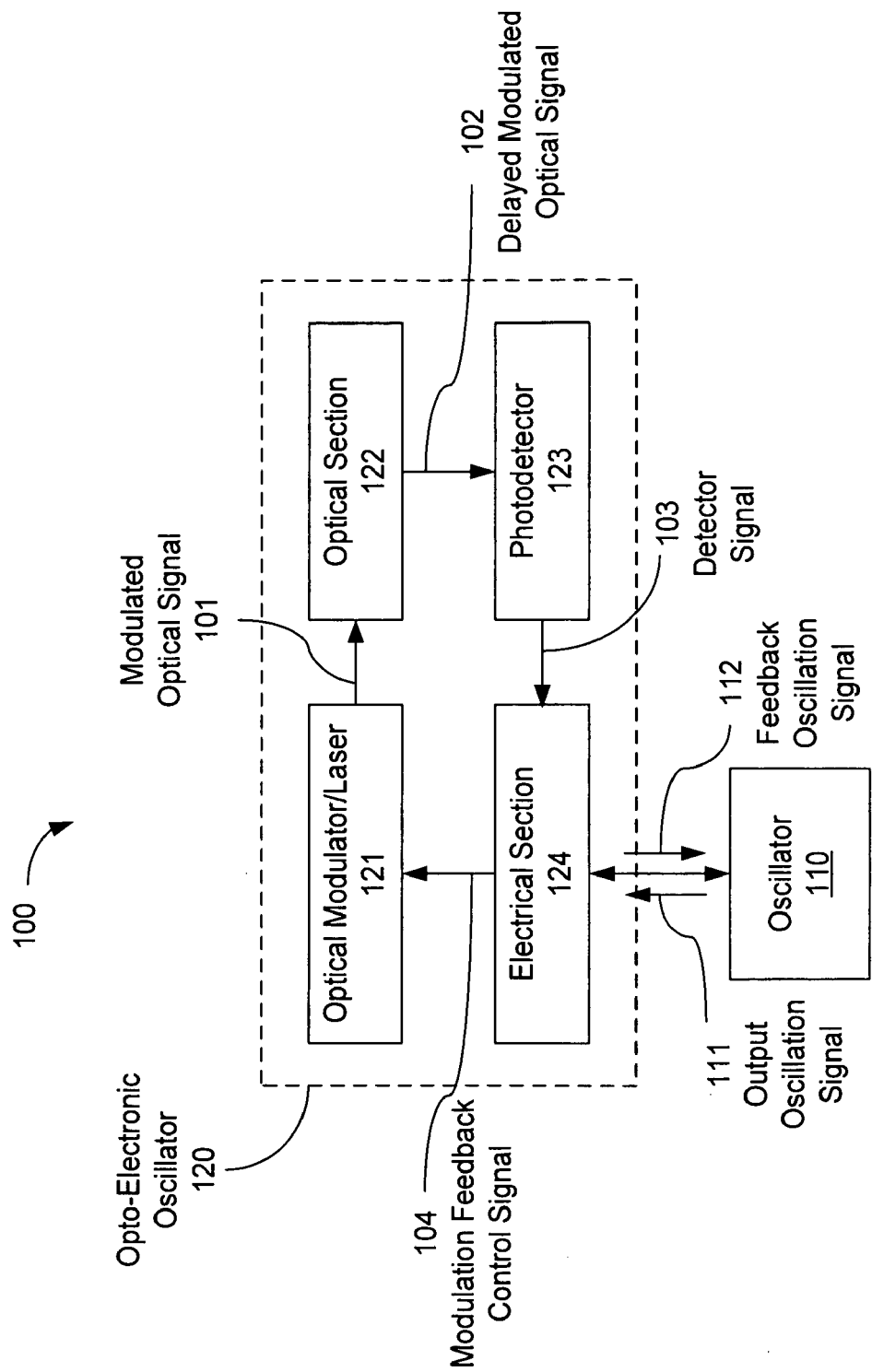
FIG. 1 shows an example of a stabilized oscillator system where an oscillator is coupled to an electrical section of a positive opto-electronic feedback loop of an opto-electronic oscillator.

Opto-electronic oscillators use positive opto-electronic feedback loops with high quality factors to achieve electro-magnetic oscillations at various frequencies. Examples of opto-electronic oscillators are described in, e.g., U.S. Pat.

Nos. 6,567,436, 5,929,430, 5,777,778, and 5,723,856. Such an opto-electronic oscillator includes an electrically controllable optical modulator or laser and at least one active opto-electronic feedback loop that comprises an optical section and an electrical section. The optical section and the electrical section are connected by a photodetector and the optical modulator to form a closed loop. The loop produces a desired delay and feeds the electrical signal in phase to the modulator to generate and sustain both optical modulation and electrical oscillation when the total loop gain of the active opto-electronic loop exceeds the total loss. The oscillation in such a closed loop can be various frequency spectral ranges that are outside the optical spectrum, including the radio frequency, microwave, millimeter- and sub-millimeter-wave bands. The generated oscillating signals are tunable in frequency and can have narrow spectral linewidths and low phase noise in comparison with the signals produced by other RF and microwaves oscillators.

Notably, the opto-electronic feedback based on optical storage and optical resonances allows the effective microwave Q-factor of the opto-electronic oscillator to increase proportionally to the frequency of the oscillation. This is in part because the resonance bandwidth of the opto-electronic oscillator is dictated by optical losses and thus is relatively small and is independent of the frequency of the oscillation. In this way, equivalent Q-factors for the oscillation on the order of $10^6$ become available at 10 GHz at the room temperature, and ever greater Q values are available towards mm and sub-millimeter band. Such effective high Q values can be used to achieve low phase noise in the oscillations at various oscillation frequencies, including the microwave, millimeter- and sub-millimeter-wave bands.

In this application, opto-electronic oscillators are used to provide a feedback mechanism for stabilizing various target oscillators to achieve stabilized oscillations with low phase noise and high Q factors in the target oscillators. A target oscillator is coupled to the electrical section of the opto-electronic feedback loop of an opto-electronic oscillator to receive a feedback signal from the electrical section of the opto-electronic feedback loop. Under this coupling and feedback, the phase noise and frequency variation in the target oscillator can be reduced to achieve a high frequency stability and spectrally pure oscillation in the target oscillator. As a result, a variety of target oscillators, beyond closed loop oscillators with two-port electronic amplifiers and a high-Q feedback circuit, may be stabilized to produce oscillation signals with low phase noise at stabilized oscillation frequencies.

FIG. 1 illustrates an example for a stabilized oscillator system 100 where a target oscillator 110 is coupled to an electrical section 124 of a positive opto-electronic feedback loop of an opto-electronic oscillator 120. The target oscillator 110 has one signal port that exports an output oscillation signal 111 to the electrical section 124 of the opto-electronic oscillator 120 and receives a feedback oscillation signal 112 from the opto-electronic oscillator 120. The injection of the feedback oscillation signal 112 enforces a steady phase into the otherwise noisy target oscillator 110 and thus causes the target oscillator 110 to stabilize the oscillation frequency and reduce the phase noise in comparison to a free-running target oscillator 110. The injection causes a frequency pulling effect or self-injection locking with a high Q external cavity. The result is a reduced linewidth and the phase noise of the oscillation in the target oscillator 110. From another point of view, the target oscillator 110 has a Q factor lower than the Q factor of the opto-electronic oscillator. Hence, the linewidth of the oscillation signal in a free-running target oscillator 110 is broader than the linewidth of the signal in the opto-electronic loop. This injection of the oscillation signal produced by the high-Q opto-electronic feedback loop effectually forces the target oscillator 110 to oscillate at a mode that matches a mode of the opto-electronic feedback loop within the narrower linewidth of the matched mode of the opto-electronic feedback loop.

The opto-electronic oscillator 120 as illustrated includes an optical modulator 121 that modulates a CW light beam to produce a modulated optical signal 101 in response to a modulation feedback control signal applied to the control port of the modulator 121. Alternatively, a laser 121 such as a diode laser that can be directly modulated to produce a modulated laser output 101. The modulator or laser 121 operates as an interface from the electrical section 124 to an optical section of the opto-electronic feedback loop in the opto-electronic oscillator 120. The modulated optical signal 101 is then fed into the optical section 122 to produce a delayed modulated optical signal 102. The optical section 122 may include an optical delay element such as a fiber delay line or an optical resonator as an optical delay element to delay and optically filter the light. In addition, the optical section 122 may include an optical amplifier to amplify the optical signal. Next in the loop, the opto-electronic oscillator 120 includes a photodetector 123 as the interface from the optical section 122 to the electrical section 124 to covert the optical signal 102 into a detector signal 103 in the electrical domain. The photodetector 123 may be implemented with various optical detectors, including high-speed traveling wave photodiodes (PDs) and uni-traveling-carrier (UTC) PDs operating at frequencies of about 100 to 300 GHz. See, e.g., Ito et al. in "InP/InGaAs uni-traveling-carrier photodiode with 310 GHz bandwidth," Electron. Lett. 36, page 1809 (2000).

The electrical section 124 is designed to receive the detector signal and to produce the modulation feedback control signal 104 and includes electrical circuitry for coupling with the target oscillator 110. The electrical section 124 may also include at least one signal bandpass filter to filter the electrical signal by rejecting undesired frequency components. A signal amplifier operable at the oscillation frequency of the system may be optionally coupled in the electrical section 124 to amplify the electrical signal. The closed opto-electronic loop formed by the blocks 121, 122, 123, and 124 has a total signal gain greater or equal to the total loop loss and provides an in-phase feedback to the optical modulator or laser 121 to sustain an oscillation.

The target oscillator 110 to be stabilized by the opto-electronic oscillator 120 may use one signal port for exporting the output oscillation signal 111 and for receiving the feedback oscillation signal 112. This feedback via a single port on the target oscillator 110 allows the above stabilization mechanism to be applied to a variety of oscillators. For example, one-port oscillator devices such as Gunn diode oscillators and impact ionization avalanche transit-time (IMPATT) diode oscillators, Klystron or Clystron electron oscillators, backward-wave oscillators, YIG oscillators and others, may be coupled in the manner shown in FIG. 1 to stabilize the oscillation frequency and to reduce the phase noise.

The system 100 in FIG. 1 may be used to remove certain technical limitations on the oscillation frequencies of opto-electronic oscillators due to technical limits of certain components such as two-port RF amplifiers which may operate up to 60 GHz. High frequency oscillators operating above 60 GHz or on the order of $10^2$ GHz may be stabilized based on the design in FIG. 1 and thus extend the application of the opto-electronic oscillator to produce high frequency signal sources that may be difficult to achieve with current opto-electronic oscillators. Hence certain uniquely available RF sources (i.e., oscillators) in short millimeter (approximately from 60 to 300 GHz) and submillimeter (approximately from 300 to 1000 GHz) range may be used as the target oscillator 110 in FIG. 1 and achieve reduction of the phase noise by utilizing the opto-electronic feedback.

Notably, the coupling between the target oscillator 110 and the opto-electronic oscillator 120 is via a single signal port of the target oscillator 110. As such, the opto-electronic feedback is not coupled to and thus does not affect any control or tuning mechanism for the target oscillator 110. Under this feedback design, the target oscillator 110 can be tuned or controlled to at different oscillation modes of the opto-electronic oscillator 120. The original tunability of free-running poor performance oscillator 110 (for example, a tunable YIG oscillator) can be preserved in simple electro-optically stabilized version as shown in FIG. 1. Upon tuning the tunable oscillator 110, for example, by changing current in the electromagnet in the YIG oscillator, the stabilized system 100 will be switching between different modes of the optoelectronic feedback loop in the opto-electronic oscillator 120. The different modes of the optoelectronic feedback loop in the opto-electronic oscillator 120 may be few-ten-KHz-apart super-modes defined by a kilometer-long fiber delay, or few-MHz-apart modes defined by a fiber cavity, or few-GHz-apart modes of an optical microresonator, in the optical section 122.

Figure 2:
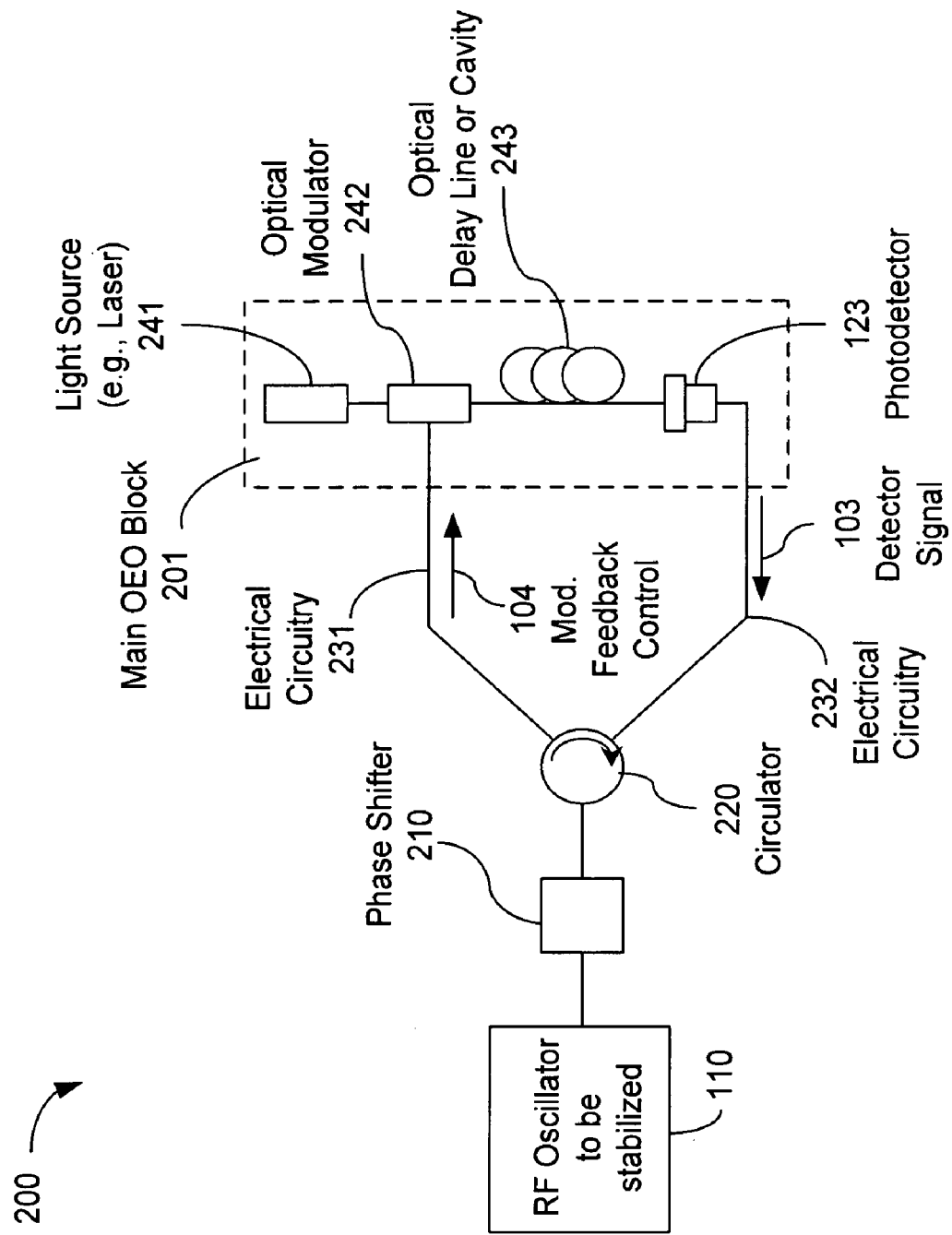
FIG. 2 shows an implementation of the system in FIG. 1.

FIG. 2 shows an exemplary system 200 that implements the stabilization mechanism in FIG. 1. The system 200 includes a target oscillator 110 to be stabilized and an opto-electronic oscillator whose main components are represented by the block 201. A CW light source 241 such as a laser is used to produce an input optical beam to an optical modulator 242 and the optical modulator 242 modulates the beam in response to the modulation feedback control signal 104 from electrical circuitry 231. The optical modulator 242 may be implemented with high-efficiency resonance modulators based on whispering-gallery modes in microresonators made of lithium niobate or other materials that exhibit an electro-optic effect. Such a modulator modulates light under a resonator resonant condition via the electro-optic effect at frequencies to 33 GHz or higher and has high efficiency with a low controlling power down to a few milliWatts. The modulated beam produced by the modulator 242 is then fed into an optical delay line or cavity 243 to produce a long optical delay. The photodetector 123 is used to convert the optical signal from the optical delay line or cavity 243 into a detector signal 103 to electrical circuitry 232.

The electrical section of the opto-electronic feedback loop includes the electrical circuitry 232, a signal circulator 220, and the electrical circuitry 231. The circulator 220 directs the detector signal 103 to the target oscillator 110 and to direct an output oscillation signal as the modulation feedback control signal 104 to the optical modulator 242. Hence, the target oscillator 110 is coupled to be part of the electrical section of the opto-electronic feedback loop. A phase shifter 210 is coupled between the target oscillator 110 and the circulator 220 to shift the phase of the signals between the target oscillator 110 to the opto-electronic feedback loop to provide a phase matching condition between the operating mode of the target oscillator 110 and one of the modes of the opto-electronic feedback loop. The optical delay line or cavity 243 may also be tunable to change the total loop delay to tune the frequencies of the modes of the opto-electronic feedback loop. The target oscillator 110 may also has its own tuning mechanism to tune the oscillating frequency.

Figure 3:
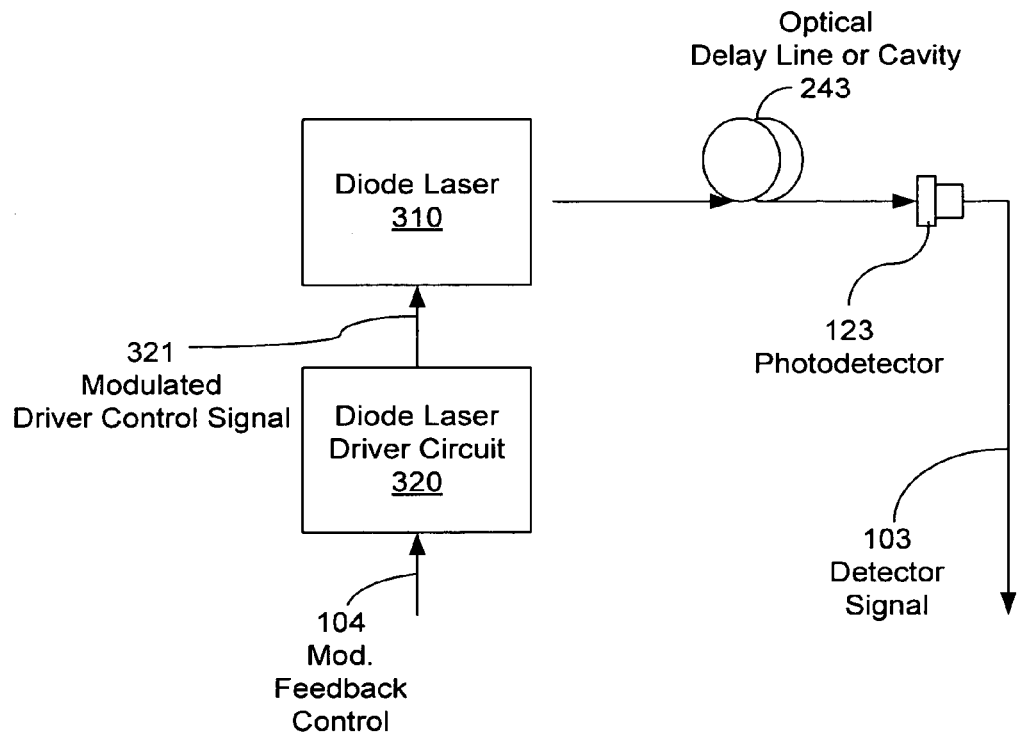
FIGS. 3 and 4 show additional examples of opto-electronic oscillators that may be used to stabilize the oscillator in FIGS. 1 and 2.

In implementing the above stabilized systems, different opto-electronic oscillators may be used. For example, FIG. 3 shows a directly-modulated diode laser 310 and its driver circuit 320 may be used to replace the separate light source 241 and the optical modulator 242 in the design in FIG. 2. The modulation feedback control signal 104 is applied to the driver circuit 320 and the driver circuit 320 produces a modulated driver control signal 321, such as a modulated driving current, to drive the diode laser 310 to produce a modulated laser output.

Figure 4:
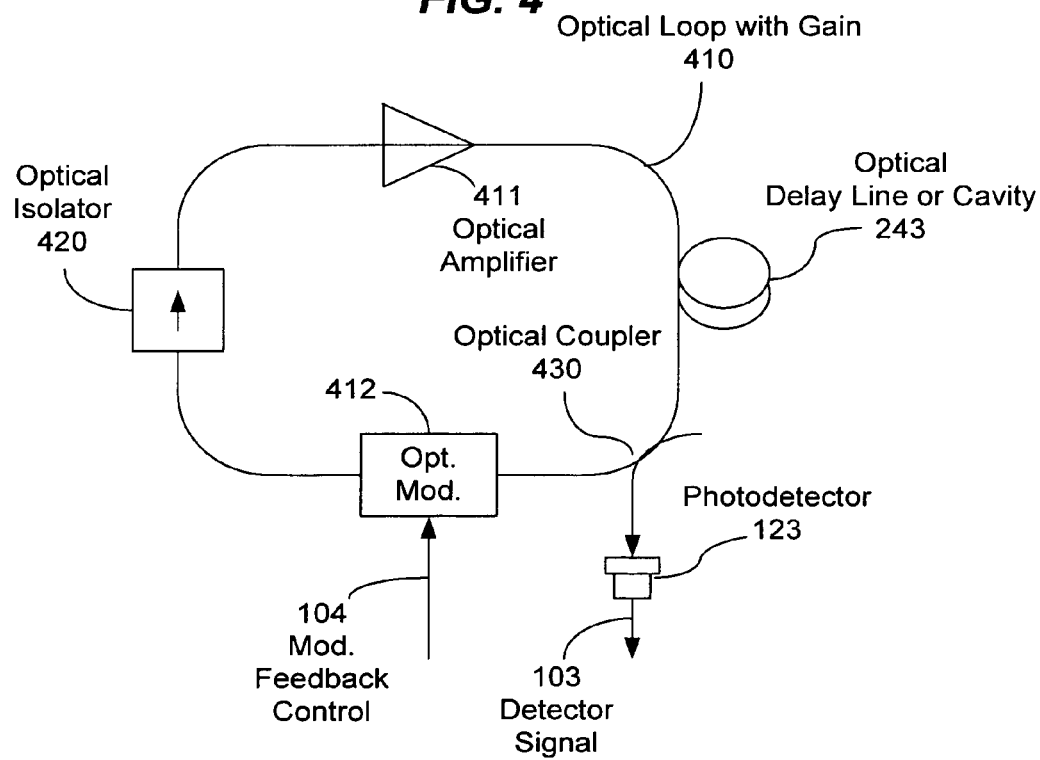

FIG. 4 further shows an exemplar coupled opto-electronic oscillator that may be used to replace the main block 201 in FIG. 2. This coupled opto-electronic oscillator directly couples a laser oscillation in an optical feedback loop to an electrical oscillation in an opto-electronic feedback loop. The laser oscillation and the electrical oscillation are correlated with each other so that both the modes and stability of one oscillation are coupled with those of the other oscillation. The optical feedback loop includes a gain medium to produce a loop gain greater than unity to effectuate the laser oscillation. This optical loop may be a Fabry-Perot resonator, a ring resonator, a whispering gallery mode resonator, and other resonator configurations. The open loop gain in the opto-electronic loop also exceeds the loss to sustain the electrical oscillation. The coupling between two feedback loops is achieved by controlling the loop gain of the optical loop by an electrical signal generated by the opto-electronic feedback loop. Coupled opto-electronic oscillators can achieve a single-mode RF oscillation without a RF bandpass filter or any additional opto-electronic feedback loops. A multi-mode laser can be used. An optical resonator can be placed in either an opto-electronic feedback loop or in the optical feedback loop of a coupled opto-electronic oscillator. In the former configuration, the frequencies of the laser modes are locked to the transmission peaks of the resonator by using a frequency control circuit. Alternatively, two optical resonators may be respectively placed in the optical loop and the opto-electronic loop at the same time.

The coupled opto-electronic oscillator in FIG. 4 uses an optical loop 410 with gain as the optical feedback loop. The loop 410 may be formed by optical fiber or other optical waveguides. The optical loop 410 forms an optical ring with an optical amplifier 411, an optical modulator 412, and an optical delay line or cavity 243. An optical isolator 420 may be used to ensure light in the loop 410 to run in only one direction. An optical coupler 430 is coupled to the optical loop 410 split a fraction of the light in the loop 410 to a photodetector 123 outside the loop 410 for the opto-electronic feedback. A part of the optical loop 410, including the optical modulator 412, the portion of the loop between the optical modulator 412 and the coupler 430, forms part of the optical section of the opto-electronic feedback loop.

The optical modulator 412 may be an electro-optic modulator or other suitable optical modulator which can operate to modulate light in response to the modulation feedback control signal 104 from the opto-electronic loop. The optical amplifier 411 and the modulator 412 in combination effectuate a laser gain medium whose gain can be controlled and modulated by the control signal 104. A semiconductor optical amplifier, for example, can be used to function as the combination of the amplifier 411 and the modulator 412.

The optical delay 243 may be an optical resonator in the loop 410. One of the advantages of placing the optical resonator 243 in the optical loop 410 is that the optical modes inside the optical loop 410 are controlled by the modes of the resonator 243, i.e., only the modes of the loop 410 that overlap with the modes of the resonator 243 can have sufficient gain to oscillate. Therefore, the optical frequencies of the laser are automatically aligned with the transmission peaks of the resonator 243. This configuration eliminates the need to lock the optical loop 410 and the resonator 243 relative to each other in other OEOs with an optical resonator in the opto-electronic feedback loop. See, U.S. Pat. No. 6,567,436. In addition, the resonator 243 inside the optical loop 410 determines the quality of both the optical laser signal generated in the optical loop 410 and the oscillation signal generated in the opto-electronic loop.

The optical resonator used for the optical delay element 243 in the optical section of the opto-electronic feedback loop may be implemented in a number of configurations, including, e.g., a Fabry-Perot resonator, a fiber cavity such as a fiber Fabry-Perot cavity and a fiber ring resonator, and an optical resonator operating in one or more whispering-gallery modes (WGMs) such as microsphere, microdisk, and microring WGM resonators. Non-spherical WGM resonators may be used. These and other optical resonator configurations can reduce the physical size of the opto-electronic oscillators and allow integration of different device components and other photonic devices and components in a compact package such as a single semiconductor chip.

When an optical resonator placed in the optical section of the opto-electronic feedback loop, the following mode matching conditions should be met for the proper operation of the opto-electronic oscillator. (1) The laser frequency $v_{laser}$ of the CW input beam to the modulator or the center laser frequency of the directly modulated laser is within one of the transmission peaks of the optical resonator so that sufficient light can transmit through the resonator to assure the open loop gain of the opto-electronic loop greater than unity. (2) The free spectral range, $FSR_r$, of the optical resonator is equal to one or a multiplicity of the mode spacing, $\Delta v_{OE\ Loop}$, of the natural modes in the opto-electronic loop. (3) The frequency $v_{OEO}$ of the opto-electronic oscillation of the opto-electronic oscillator equals to the multiples of the free spectral range of the resonator.

The following sections describe exemplary WGM resonator configurations suitable for the above implementations.

Figure 5:
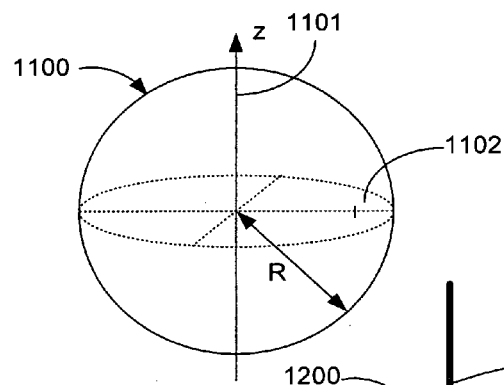
FIGS. 5, 6, 7, 8A and 8B show examples of whispering gallery mode resonators that may be used in the optical section of the opto-electronic feedback loop of an opto-electronic oscillator in FIGS. 1, 2, 3, and 4.
Figure 6:
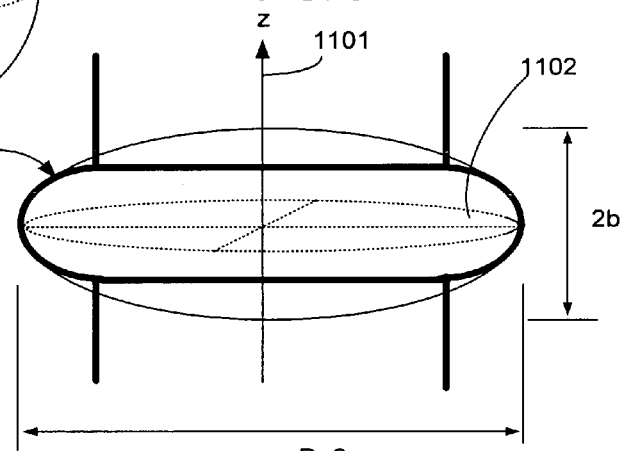
Figure 7:
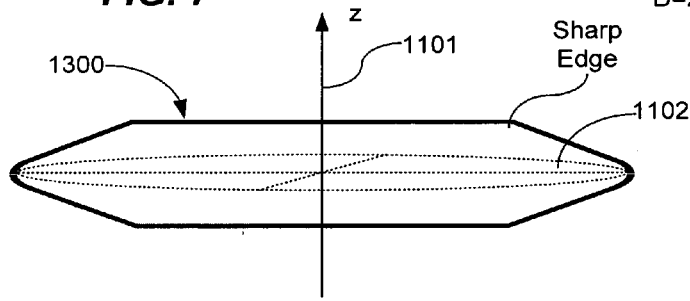

FIGS. 5, 6, and 7 illustrate three exemplary geometries for implementing the WGM resonators. FIG. 5 shows a spherical WGM resonator 1100 which is a solid dielectric sphere. The sphere 1100 has an equator in the plane 1102 which is symmetric around the z axis 1101. A WG mode exists around the equator within the spherical exterior surface and circulates within the resonator 1100. The spherical curvature of the exterior surface around the equator plane 1102 provides spatial confinement along both the z direction and its perpendicular direction to support the WG modes. The eccentricity of the sphere 1100 generally is low.

FIG. 6 shows an exemplary spheroidal microresonator 1200. This resonator 1200 may be formed by revolving an ellipse (with axial lengths a and b) around the symmetric axis along the short elliptical axis 1101 (z). The eccentricity of resonator 1100 is $(1-b^2/a^2)^{1/2}$ and is generally high, e.g., greater than $10^{-1}$. Hence, the exterior surface is the resonator 1200 is not part of a sphere and provides more spatial confinement on the modes along the z direction than a spherical exterior. The equator plane 1102 at the center of the resonator 200 is perpendicular to the axis 1101 (z) and the WG modes circulate near the circumference of the plane 1102 within the resonator 1200.

FIG. 7 shows another exemplary WGM resonator 1300 which has a non-spherical exterior where the exterior profile is a general conic shape which can be mathematically represented by a quadratic equation of the Cartesian coordinates. Similar to the geometries in FIGS. 5 and 6, the exterior surface provides curvatures in both the direction in the plane 1102 and the direction of z perpendicular to the plane 1102 to confine and support the WG modes. Such a non-spherical, non-elliptical surface may be, among others, a parabola or hyperbola.

The above three exemplary geometries in FIGS. 5, 6, and 7 share a common geometrical feature that they are all axially or cylindrically symmetric around the axis 1101 (z) around which the WG modes circulate in the plane 1102. The curved exterior surface is smooth around the plane 1102 and provides two-dimensional confinement around the plane 1102 to support the WG modes.

Notably, the spatial extent of the WG modes in each resonator along the z direction 1101 is limited above and below the plane 1102 and hence it may not be necessary to have the entirety of the sphere 1100, the spheroid 1200, or the conical shape 1300. Instead, only a portion of the entire shape around the plane 1102 that is sufficiently large to support the whispering gallery modes may be used to for the WGM resonator. For example, rings, disks and other geometries formed from a proper section of a sphere may be used as a spherical WGM resonator.

Figure 8A:
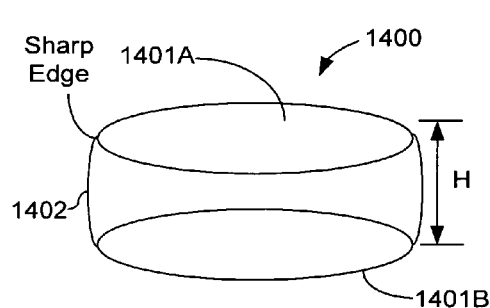
Figure 8B:
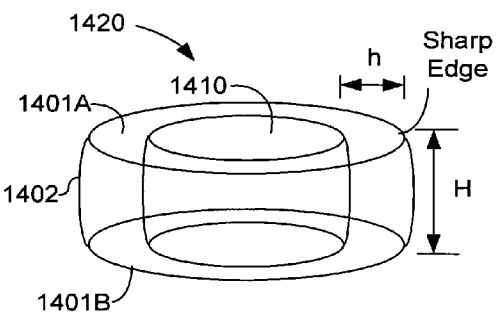

FIGS. 8A and 8B show a disk-shaped WGM resonator 1400 and a ring-shaped WGM resonator 1420, respectively. In FIG. 8A, the solid disk 1400 has a top surface 1401A above the center plane 102 and a bottom surface 1401B below the plane 1102 with a distance H. The value of the distance H is sufficiently large to support the WG modes. Beyond this sufficient distance above the center plane 1102, the resonator may have sharp edges as illustrated in FIGS. 7, 8A, and 8B. The exterior curved surface 1402 can be selected from any of the shapes shown in FIGS. 5, 6, and 7 to achieve desired WG modes and spectral properties. The ring resonator 1420 in FIG. 8B may be formed by removing a center portion 1410 from the solid disk 1400 in FIG. 8A. Since the WG modes are present near the exterior part of the ring 1420 near the exterior surface 1402, the thickness h of the ring may be set to be sufficiently large to support the WG modes.

In general, an optical coupler is needed to couple optical energy into or out of the WGM resonator by evanescent coupling. Angle-polished fiber tips, waveguides, and GRIN lenses or prisms may be used as the optical couplers. In addition, evanescent couplers such as an coupler formed from photonic bandgap materials may be used for coupling with the resonators.

In summary, only a few implementations are disclosed. However, it is understood that variations and enhancements may be made.

The invention claimed is:

1. A device, comprising:
   an oscillator producing an electrical oscillation signal; and
   an opto-electronic oscillator comprising a positive feedback loop which comprises an optical section, an electrical section, and an optical detector to connect the optical section and the electrical section, wherein the optical section comprises an optical modulator modulating light under control of an electrical output signal from the electrical section and an optical delay line to receive an optical output of the optical modulator,
   wherein the electrical section is coupled to receive the electrical oscillation signal from the oscillator and to send an electrical signal in the electrical section into the oscillator to suppress phase noise in the oscillator.

2. A device as in claim 1, further comprising a phase shifter coupled between the electrical section of the opto-electronic oscillator and the oscillator.

3. A device as in claim 1, further comprising an electrical signal circulator coupled to the electrical section to direct the electrical oscillation signal from the oscillator into the electrical section and to direct the electrical signal in the electrical section into the oscillator.

4. A device as in claim 1, wherein the optical delay line comprises a fiber line.

5. A device as in claim 1, wherein the optical delay line comprises a fiber cavity.

6. A device as in claim 1, wherein the optical delay line comprises an optical resonator.

7. A device as in claim 6, wherein the optical resonator comprises a whispering gallery mode resonator.

8. A device as in claim 7, wherein the whispering gallery mode resonator is a spherical resonator.

9. A device as in claim 7, wherein the whispering gallery mode resonator is a spheroidal microresonator.

10. A device as in claim 7, wherein the whispering gallery mode resonator is a spherical disk resonator.

11. A device as in claim 1, wherein the opto-electronic oscillator comprises a laser to supply said light to the optical modulator and to the optical delay line.

12. A device as in claim 1, wherein the optical modulator is a directly modulated laser to produce a modulated laser beam.

13. A device as in claim 1, wherein the optical modulator comprises a whispering gallery mode resonator that exhibits an electro-optic effect and modulates light via the electro-optic effect.

14. A device as in claim 1, further comprising a laser cavity in which the optical modulator is placed and to which the optical section of the positive feedback loop is coupled, wherein the optical modulator is operable to modulate laser light produced by the laser cavity, and at least a portion of the modulated laser light is coupled to the optical section of the positive feedback loop.

15. A device as in claim 1, wherein the optical detector is a high-speed traveling wave photodiode or a uni-traveling-carrier photodiode.

16. A device as in claim 1, wherein the oscillator is a tunable oscillator and the device further comprising a tuning mechanism to tune the oscillator to switch an oscillation mode between two different modes of the opto-electronic oscillator.

17. A device as in claim 1, wherein the oscillator is coupled to the electrical section via a single port in the oscillator for both receiving the electrical oscillation signal from the oscillator and sending the electrical signal into the oscillator.

18. A device as in claim 1, wherein the oscillator is a Gunn diode oscillator.

19. A device as in claim 1, wherein the oscillator is an impact ionization avalanche transit-time (IMPATT) diode oscillator.

20. A device as in claim 1, wherein the oscillator is a Klystron oscillator.

21. A device as in claim 1, wherein the oscillator is a backward-wave oscillator.

22. A device as in claim 1, wherein the oscillator is a YIG oscillator.

23. A method for stabilizing an oscillator, comprising:

directing an output oscillation signal from a signal port of an oscillator into an electrical section of an opto-electronic oscillator having an optical section and the electrical section which form a closed loop with a positive feedback; and injecting an oscillation signal that is produced in the electrical section from an optical signal in the optical section into the signal port of the oscillator to stabilize the oscillator.

24. A method as in claim 23, wherein the oscillator is tunable, the method further comprising tuning the oscillator to switch between different modes of the closed loop in the opto-electronic oscillator.

25. A method as in claim 23, further comprising shifting a phase of each signal coupled between the oscillator and the closed loop to match a mode of the oscillator with a mode of the closed loop.

26. A method as in claim 23, wherein the opto-electronic oscillator is a coupled opto-electronic oscillator.

27. A method as in claim 23, further comprising using an optical resonator in the optical section of the closed loop.

* * * * *